(12) United States Patent
Sone et al.

(10) Patent No.: US 6,555,167 B2
(45) Date of Patent: Apr. 29, 2003

(54) METHOD FOR GROWING HIGH QUALITY GROUP-III NITRIDE THIN FILM BY METAL ORGANIC CHEMICAL VAPOR DEPOSITION

(75) Inventors: Cheol-soo Sone, Kyungki-do (KR); Ok-hyun Nam, Kyungki-do (KR); Hyeong-soo Park, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 09/881,711

(22) Filed: Jun. 18, 2001

(65) Prior Publication Data
US 2002/0192373 A1 Dec. 19, 2002

(51) Int. Cl.$^7$ ................................................ C23C 16/34
(52) U.S. Cl. ..................... 427/255.394; 427/255.34; 427/255.7
(58) Field of Search .................. 427/248.1, 255.11, 427/255.14, 255.15, 255.28, 255.34, 255.394, 419.1, 419.7, 419.8, 255.7

(56) References Cited

U.S. PATENT DOCUMENTS 5,650,198 A * 7/1997 Denbaars et al. ..... 427/255.394
6,261,931 B1 * 7/2001 Keller et al. ................. 438/492

FOREIGN PATENT DOCUMENTS

JP            09-153643        *  6/1997        ........... H01L/33/00

* cited by examiner

Primary Examiner—Timothy Meeks
Assistant Examiner—William Phillip Fletcher, III
(74) Attorney, Agent, or Firm—Burns Doane Swecker & Mathis, LLP

(57) ABSTRACT

A method for growing a group-III nitride compound (including BN, AlN, GaN and InN) semiconductor film, to which much attention is currently paid in the field of optical semiconductors. If the internal pressure of a reactor increases, vertical growth becomes faster, and internal crystal defects are reduced while many fine pits are generated in view of outer appearance. If the internal pressure of a reactor decreases, vertical growth becomes slower and lateral growth becomes relatively faster, producing fewer pits in view of outer appearance, while internal crystal defects increase. Based on such experimental results, nitride crystals having many fine pits and fewer internal defects are first grown by a high pressure growth method and the fine pits relatively increased in number are then filled by a low pressure growth method, thereby attaining a high quality group-III nitride film.

7 Claims, 4 Drawing Sheets

METHOD FOR GROWING HIGH QUALITY GROUP-III NITRIDE THIN FILM BY METAL ORGANIC CHEMICAL VAPOR DEPOSITION

BACKGROUND OF THE INVENTION

1. Field of the Invention

The present invention relates to a method for growing a group-III nitride compound (Including BN, AlN, GaN and InN) semiconductor film, and more particularly, a method for growing a high quality group-III nitride thin film by a metal organic chemical vapor deposition (MOCVD) method, which can improve characteristics of the thin film by performing thin film growth in two steps.

2. Description of the Related Art

FIG. 1 is a vertical cross-sectional view of a GaN thin film grown by a conventional MOCVD method. As shown in FIG. 1, the GaN thin film is grown such that a GaN buffer layer 2 is first grown on a sapphire substrate 1 at 400 to 600° C. by a MOCVD method and a GaN layer 3 is then grown thereon at 900 to 1100° C.

The characteristics of the group-III nitride thin film grown by the MOCVD method vary according to various experimental factors. In particular, it has been found that a great change in initial growth mechanism was caused by a change in the pressure of a reactor during a growing step.

The basic characteristic of a nitride compound semiconductor device is crystallinity, which is optimized according to the type of a reactor used and experimental conditions employed by researchers. However, the researchers' finding was that the crystallinity was deteriorated under the conditions that are advantageous to growth of multiple quantum well, p-GaN or AlGaN, e.g., a low pressure of reactor used.

SUMMARY OF THE INVENTION

To solve the above-described problems, it is an object of the present invention to provide a method for growing a high quality group-III nitride film by a metal organic chemical vapor deposition (MOCVD) method, by which the crystallinity and surface morphology of the film can be improved by a multi-step growth method in which the pressure of a reactor is changed.

To accomplish the above object, there is provided a method for growing a high quality group-III nitride film on a substrate by a metal organic chemical vapor deposition method, including the steps of forming a group-III nitride buffer layer on the substrate, forming a first group-III nitride film on the group-III nitride buffer layer by increasing the internal pressure of a reactor to a predetermined level or greater, and forming a second group-III nitride film on the first group-III nitride film by decreasing the internal pressure of a reactor to a predetermined level or below, which is lower than that for growth of the first group-III nitride film.

In the present invention, the substrate is preferably a sapphire substrate, a silicon substrate or a GaAs substrate, and the nitride buffer layer is preferably formed of $Al_xGa_{1-x}N$ ($0 \leq x \leq 1$) or $In_xGa_{1-x}N$ ($0 \leq x \leq 1$).

Also, the first and second group-III nitride films are preferably formed of is GaN-based nitride. Preferably, the first group-III nitride film is grown under the pressure in the range of 150 to 400 Torr, and the second group-III nitride film is grown under the pressure in the range of 50 to 150 Torr.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

A method for growing a high quality group-III nitride film according to the present invention by a metal organic chemical vapor deposition (MOCVD) method will now be described in detail with reference to the accompanying drawings.

Figure 1:
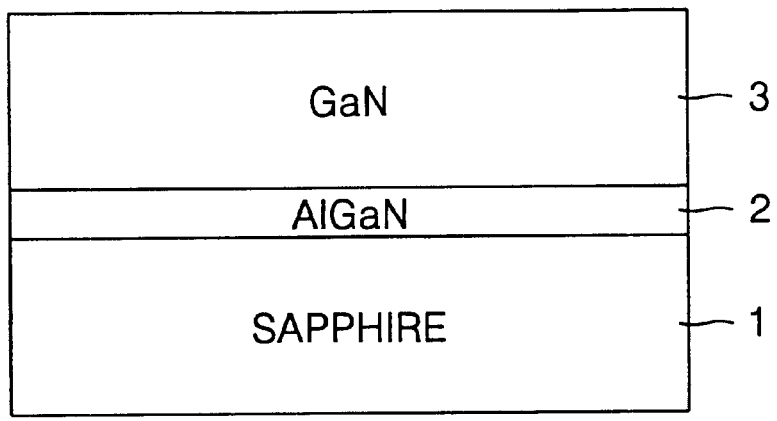
FIG. 1 is a vertical cross-sectional view of a gallium nitride (GaN) film grown by a conventional MOCVD method.
Figure 2:
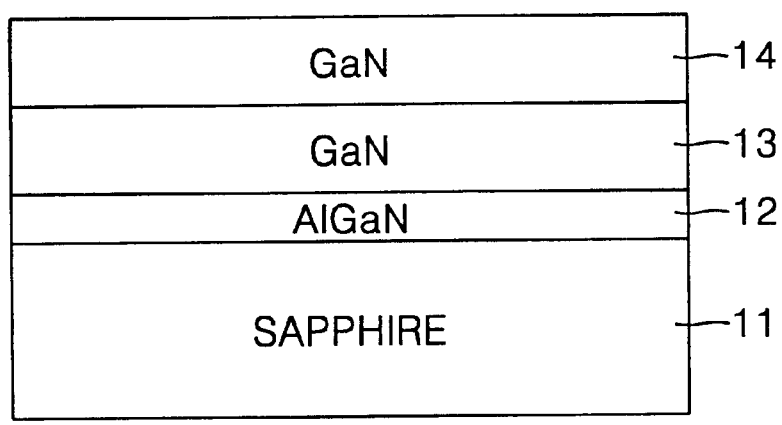
FIG. 2 is vertical cross-sectional view of a gallium nitride (GaN) film grown by an MOCVD method according to the present invention.

FIG. 2 is vertical cross-sectional view of a group-III nitride film grown by an MOCVD method according to the present invention. The group-III nitride film grown by an MOCVD method according to the present invention has improved crystallinity and surface morphology by using a two-step growth method in which the pressure of a first step is higher than that of a second step. In other words, in order to overcome deteriorated crystallinity and surface morphology of the grown group-III nitride film, the pressure of a reactor is increased in the first step to improve the crystallinity of the film, and the pressure of the reactor is decreased in the second step to obtain a sharply steep interface with reduced vapor reaction. Also, it is possible to grow a device structure with excellent uniformity in thickness. Further, from the viewpoint of consumption of materials, the growth method according to the present invention has a remarkable effect of saving material costs.

A method of manufacturing the group-III nitride semiconductor film will now be described in detail.

In the method for growing a high quality group-III nitride film by an MOCVD according to the present invention, a close spaced showerhead type reactor is used.

First, an AlGaN buffer layer 12 having a thickness of 20 to 30 nm is grown on a sapphire substrate 11 at a relatively low temperature of 400 to 600° C., and then the temperature of the reactor is raised to approximately 1000° C. while varying the pressure of the crystal growth in the range of 150 to 400 Torr, so that a first group-III nitride film 13 having a thickness of greater than or equal to 0.5 $\mu$m (step 1), is grown.

Next, after growing the first group-III nitride film 13, the pressure of the reactor is lowered to 50 to 150 Torr without supplying source gases while maintaining the temperature of the reactor at approximately 1000° C., so that a second group-III nitride film 14 is formed (step 2). Here, the composition ratio of the AlGaN buffer layer 12 is $Al_xGa_{1-x}N$ ($0 \leq x \leq 1$).

Figure 3:
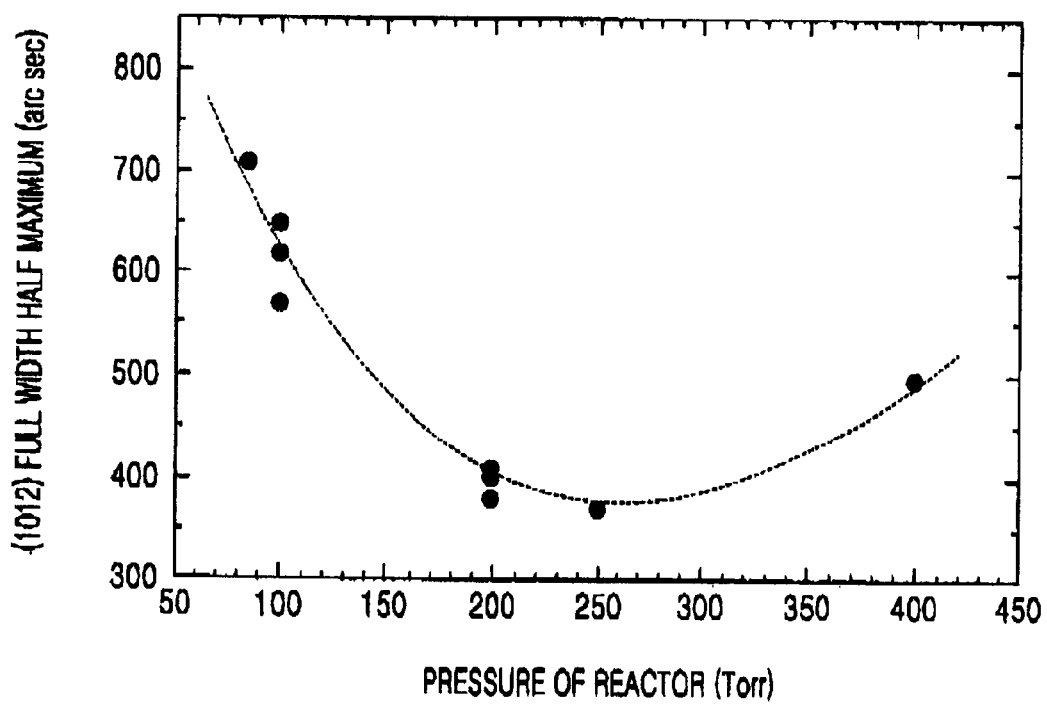
FIG. 3 is a graph showing a change in values of (10–12) full width half maximum of X-ray diffraction pattern of the GaN film shown in FIG. 2.

As described above, if the pressure of the reactor increases, the decomposition of the AlGaN buffer layer 12 is facilitated so that the overall grain size of a nucleation layer becomes large, resulting in reduction in density. If the sizes of grains increase, the density of defects formed at the interface sharply decreases. Also, as the pressure of the reactor increases, dissociation of hydrogen used as a carrier gas is promoted to thus increase the surface mobility of group-III elements, which may promote the growth of grains. Such a change in the growth mechanism, as shown in FIG. 3, may cause a reduction in full width half maximum of a double crystal diffraction pattern according to increase in the growth pressure, which means a decrease in the defect density. However, as grains are combined, fine pits are likely generated at the coalesced boundary between grains, which causes a current leakage in fabrication of a device, resulting in easy breakdown of the device. Conclusively, if the internal pressure of a reactor increases during growth of a group-III nitride film, vertical growth becomes faster, and internal crystal defects are reduced while many fine pits are generated in view of outer appearance.

On the other hand, if the internal pressure of a reactor decreases during growth of a group-III nitride film, vertical growth becomes slower and lateral growth becomes relatively faster, producing fewer pits in view of outer appearance, while internal crystal defects increase.

Figure 4A:
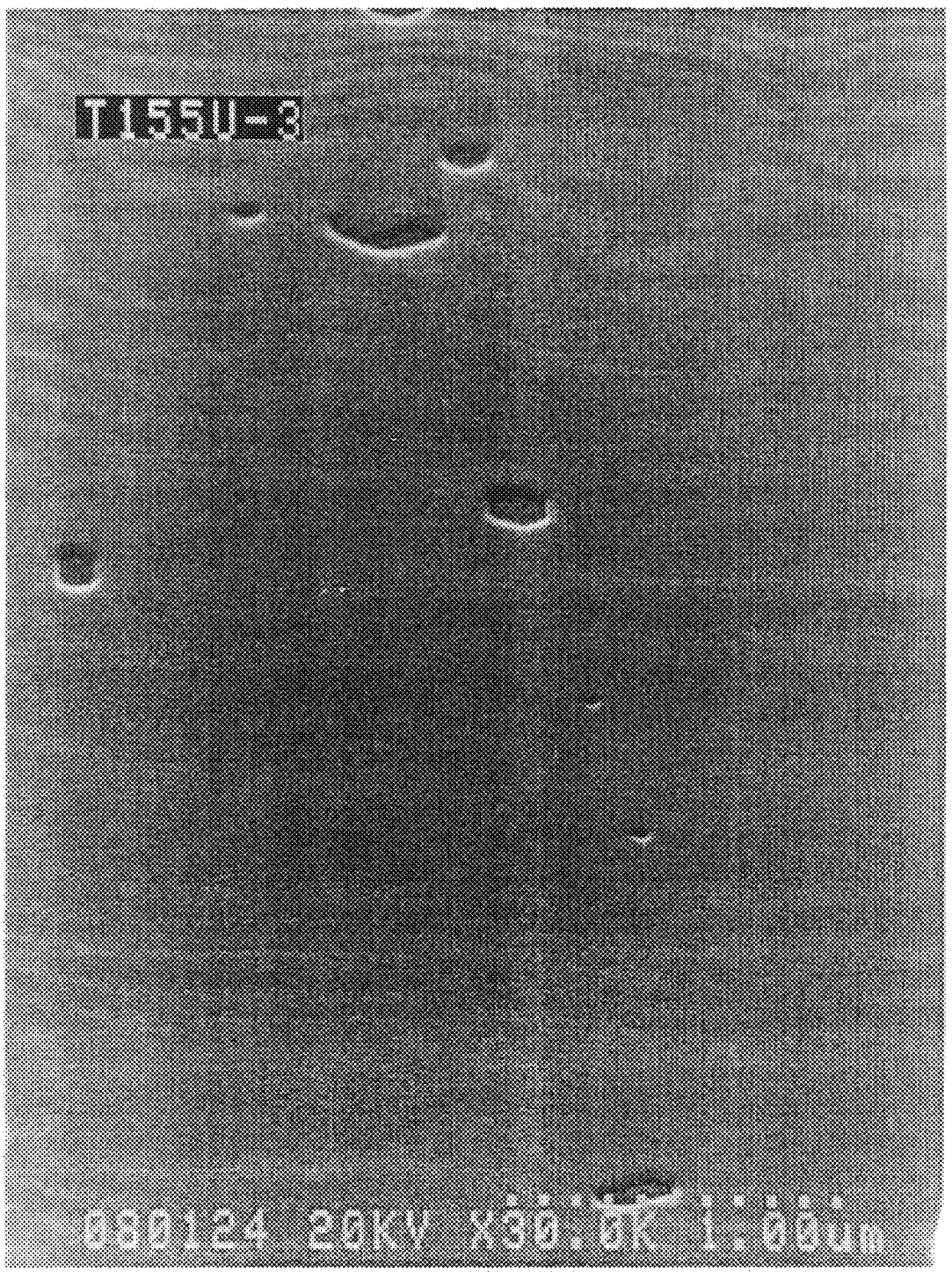
FIG. 4A is a scanning electron microscopy (SEM) image of GaN film grown under a pressure condition of 200 Torr.
Figure 4B:
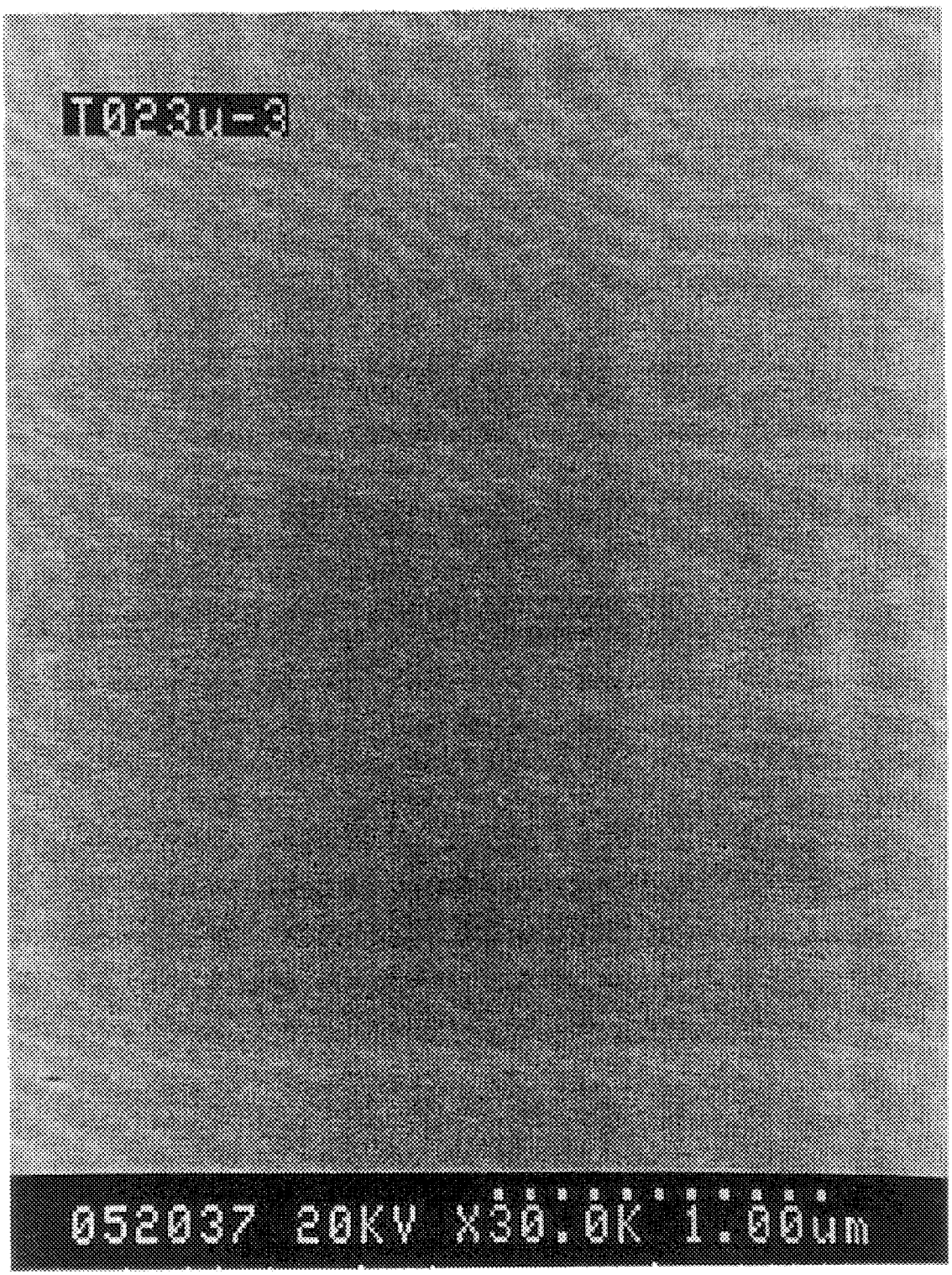
FIG. 4B is a SEM image of GaN film grown twice first under a pressure condition of 200 Torr and second under a pressure condition 100 Torr.

FIGS. 4A and 4B illustrate fine pits observed on GaN films each grown under different pressure conditions. In other words, as shown in FIG. 4A, fine pits are observed on the surface of a GaN film grown only under a high pressure of 200 Torr. however, as shown in FIG. 4B, few fine pits are observed on the surface of a GaN film grown twice in two steps performed first under a high pressure of 200 Torr and second under a low pressure of 100 Torr.

Based on the experimental result, in the present growth method, nitride crystals having many fine pits and fewer internal defects are grown by a high pressure growth method in the first step and the fine pits are filled by a low pressure growth method in the second step, thereby attaining a high quality GaN film suitable for growth of a device structure.

As described above, in the method for growing a high quality group-III nitride film according to the present invention by an MOCVD method, if the internal pressure of a reactor increases, vertical growth becomes faster, and internal crystal defects are reduced while many fine pits are generated in view of outer appearance. If the internal pressure of a reactor decreases, vertical growth becomes slower and lateral growth becomes relatively faster, producing fewer pits in view of outer appearance, while internal crystal defects increase. Based on such experimental results, nitride crystals having many fine pits and fewer internal defects are first grown by a high pressure growth method and the fine pits relatively increased in number are then filled by a low pressure growth method, thereby attaining a device of a high quality nitride film. In other words, advantageous points of each of the high pressure growth method and the low pressure growth method are utilized for achieving improvement in characteristics of a thin film.

What is claimed is:

1. A method for growing a group-III nitride film on a substrate by a metal organic chemical vapor deposition method, comprising the steps of:

forming a group-III nitride buffer layer on the substrate in a reactor;

forming a first group-III nitride film directly on the group-III nitride buffer layer by increasing the internal pressure of the reactor to a first pressure in the range of 150 to 400 Torr; and forming a second group-III nitride film on the first group-III nitride film by decreasing the internal pressure of the reactor to a second pressure in the range of 50 to 150 Torr, wherein the first pressure is higher than the second pressure and wherein the step of forming the second group-III nitride film on the first group-III nitride film is the final group-III nitride film growth step of the method.

2. The method according to claim 1, wherein the substrate is one selected from a sapphire substrate, a silicon substrate and a GaAs substrate.

3. The method according to claim 1, wherein the nitride buffer layer is formed of one of $Al_xGa_{1-x}N$ ($0 \leq x \leq 1$) and $In_xGa_{1-x}N$ ($0 \leq x \leq 1$).

4. The method according to claim 1, wherein the first and second group-III nitride films are formed of GaN-based nitride.

5. The method according to claim 1, wherein the first group-III nitride film has a thickness of greater than or equal to 0.5 $\mu$m.

6. The method according to claim 1, wherein the first group-III nitride film is formed having a plurality of fine pits.

7. The method according to claim 6, wherein the plurality of fine pits are filled by the step of forming the second group-III nitride film on the first group-III nitride film.

* * * * *